(12) United States Patent
Park et al.

(10) Patent No.: US 12,298,273 B2
(45) Date of Patent: May 13, 2025

(54) APPARATUS FOR DETECTING LOCATION OF FOREIGN MATERIAL OF LOW-VOLTAGE BATTERY CELL AND ANALYTICAL METHOD USING THE SAME

(71) Applicant: LG ENERGY SOLUTION, LTD., Seoul (KR)

(72) Inventors: Min Choon Park, Daejeon (KR); Dong Hee Kim, Daejeon (KR); Sang Su Ahn, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/270,811

(22) PCT Filed: Dec. 8, 2022

(86) PCT No.: PCT/KR2022/019876
§ 371 (c)(1),
(2) Date: Jul. 3, 2023

(87) PCT Pub. No.: WO2023/121069
PCT Pub. Date: Jun. 29, 2023

(65) Prior Publication Data
US 2024/0060934 A1 Feb. 22, 2024

(30) Foreign Application Priority Data
Dec. 22, 2021 (KR) .......................... 10-2021-0184656

(51) Int. Cl.
*G01N 27/61* (2006.01)
*G01R 31/52* (2020.01)

(52) U.S. Cl.
CPC ............. *G01N 27/61* (2013.01); *G01R 31/52* (2020.01)

(58) Field of Classification Search
USPC ........................................................ 324/456
See application file for complete search history.

(56) References Cited

U.S. PATENT DOCUMENTS 7,736,795 B2    6/2010  Sakamoto et al.
11,287,478 B2   3/2022  Min et al.
(Continued)

FOREIGN PATENT DOCUMENTS

JP    2003-022946 A    1/2003
JP    2007-242320 A    9/2007
(Continued)

OTHER PUBLICATIONS

Extended European search report dated Jun. 21, 2024 of the corresponding European Patent Application No. 22911702.3. Note: KR 10-2010-0075294 cited therein is already of record.
(Continued)

*Primary Examiner* — Farhana A Hoque
(74) *Attorney, Agent, or Firm* — Morgan, Lewis & Bockius LLP (57) ABSTRACT

An apparatus for detecting the location of a foreign material of a low-voltage battery cell includes a first and second measurement electrodes respectively on a positive electrode and a negative electrode of the battery cell to measure a leakage current; a current measuring device to measure a leakage current; and a data processor to process a measured leakage current data. The first and second measurement electrodes each have a structure in which a plurality of unit electrodes to which coordinate information is assigned are collected. The current measuring device measures a leakage current flowing through the unit electrode of the first measurement electrode and the unit electrode of the second measurement electrode that have the same coordinate information. The data processing part checks the location of a foreign material from a leakage current data through a
(Continued)

coordinate information of a unit electrode having a large leakage current.

13 Claims, 6 Drawing Sheets

(56) References Cited

U.S. PATENT DOCUMENTS

| | | | |
|---|---|---|---|
| 2019/0324089 A1* | 10/2019 | Kang | ............ G01R 31/389 |
| 2020/0150060 A1 | 5/2020 | Lee et al. | |
| 2020/0400747 A1 | 12/2020 | Min et al. | |
| 2021/0190874 A1 | 6/2021 | Kim et al. | |
| 2023/0358813 A1 | 11/2023 | Nakashima et al. | |

FOREIGN PATENT DOCUMENTS

| | | | |
|---|---|---|---|
| JP | 4967421 B2 | 7/2012 |
| JP | 5488162 B2 | 5/2014 |
| KR | 10-2010-0075294 A | 7/2010 |
| KR | 10-1790118 B1 | 10/2017 |
| KR | 10-2019-0006920 A | 1/2019 |
| KR | 10-2020-0017824 A | 2/2020 |
| KR | 10-2020-0055457 A | 5/2020 |
| KR | 10-2020-0059563 A | 5/2020 |
| KR | 10-2161028 B1 | 10/2020 |
| KR | 10-2263601 B1 | 6/2021 |
| KR | 10-2290736 B1 | 8/2021 |
| WO | 2021100819 A1 | 5/2021 |

OTHER PUBLICATIONS

International Search Report and Written Opinion dated Mar. 24, 2023 issued in corresponding International Patent Application No. PCT/KR2022/019876.

* cited by examiner

APPARATUS FOR DETECTING LOCATION OF FOREIGN MATERIAL OF LOW-VOLTAGE BATTERY CELL AND ANALYTICAL METHOD USING THE SAME

TECHNICAL FIELD

This application claims the benefit of priority based on Korean Patent Application No. 10-2021-0184656 filed on Dec. 22, 2021.

The present invention relates to an analyzer capable of accurately identifying a location of a foreign material in a low-voltage battery cell, and a method for analyzing a foreign material of a low-voltage battery cell using the same.

BACKGROUND TECHNOLOGY OF THE INVENTION

As the price of energy sources rises due to depletion of fossil fuels and interest in environmental pollution increases, the demand for eco-friendly alternative energy sources is becoming an essential factor for a future life, and in particular, as technology development and demand for mobile devices increase, the demand for secondary batteries as an energy source is rapidly increasing.

Typically, in terms of the shape of the battery, there is a high demand for prismatic secondary batteries and pouch-type secondary batteries that can be applied to products such as mobile phones with the thin thickness, and in terms of materials, there is a high demand for lithium secondary batteries such as lithium-ion batteries and lithium-ion polymer batteries with high energy density, high discharge voltage, and output stability.

Secondary batteries are also classified depending on how an electrode assembly, which has a structure having a positive electrode, a negative electrode, and a separator interposed between the positive electrode and the negative electrode, is structured, and representatively, there may be a jelly-roll (wound type) electrode assembly having a structure in which long sheet-type positive electrodes and negative electrodes are wound with a separator interposed therebetween, a stack-type (layered type) electrode assembly in which multiple positive electrodes and negative electrodes units of a predetermined size are stacked in order with a separator interposed therebetween, a stack-folding type electrode assembly having a structure of winding unit cells such as a bi-cell or a full cell, etc. in which positive electrodes and negative electrodes of a predetermined unit are layered with a separator interposed therebetween, etc.

In addition, secondary batteries are manufactured by injecting an electrolyte solution, which is a liquid electrolyte, in a state where the electrode assembly is accommodated inside a battery container, and sealing the battery container.

A secondary battery that has been manufactured may have various defects due to various causes during an assembly process, manufacturing process, or during its usage. Among them, a phenomenon in which a battery that has been manufactured exhibits a voltage drop behavior higher than a self-discharge rate is called a low-voltage.

This low-voltage defect phenomenon is typically caused by a foreign material located inside the battery, and typically, when a metal foreign material exists in a positive electrode, the metal foreign material grows into a dendrite at a negative electrode, and such a dendrite causes an internal short circuit (short) of a secondary battery. As a result, the internal short circuit of the secondary battery causes failure, damage, ignition, and the like of the secondary battery.

In order to identify the type of a foreign material that causes such a low-voltage detect, in a low-voltage defective battery cell, the foreign material is sampled, and image analysis and elemental analysis are performed on the foreign material using FE-SEM-EDS. Conventionally, in order to sample foreign materials that cause low-voltage, an open circuit voltage (OCV) is monitored in low-voltage battery cells in units of monocells, monocells having an amount of voltage drop that exceeds the amount of self-discharge are selected, foreign materials in the corresponding monocells and the monocells adjacent thereto are visually confirmed, and then the foreign materials were sampled. However, such a conventional method requires a lot of time because a foreign material has to be found with the naked eye, and accordingly, fatigue due to analysis is accumulated due to a long-term performance, and has a low probability of finding a foreign material that causes an actual leakage current.

In addition, as another method of sampling foreign material, there is a HI-POT test. The HI-POT test freezes an electrolyte under liquid nitrogen and then applies a high voltage to induce burning by concentrating a current on a potential short-circuit location, and after checking the location of the burnt monocell by disassembling the battery cell, the foreign material is sampled. But there was a problem that there was a great concern about information loss of the sampled specimen due to the explosive power caused by applying the high voltage.

DESCRIPTION OF THE INVENTION

Technical Problem

The present invention is to solve the above problems of the prior art, and it is directed to provide an apparatus for detecting the location of a foreign material capable of solving fatigue due to a time-consuming analysis and having a high probability of finding a foreign material when searching for the location of foreign material by visual inspection, and a detection method thereof.

Technical Solution

An apparatus for detecting the location of a foreign material of a low-voltage battery cell according to the present invention includes: a first measurement electrode and a second measurement electrode disposed on a positive electrode and a negative electrode of a battery cell to be evaluated, respectively, to measure a leakage current; a current measuring device for measuring a leakage current; and a data processing part for processing a measured leakage current data, wherein the first and second measurement electrodes each have a structure in which a plurality of unit electrodes to Which coordinate information is assigned are collected, the current measuring device measures a leakage current flowing through the unit electrode of the first measurement electrode and the unit electrode of the second measurement electrode that have the same coordinate information and are electrically connected, and the data processing part checks the location of a foreign material from a leakage current data through a coordinate information of a unit electrode having a large leakage current.

The apparatus for detecting the location of a foreign material of a low-voltage battery cell according to an exemplary embodiment of the present invention further includes a first jig and a second jig, wherein the first and second jigs are configured to press a laminate of the first and second measurement electrodes and the battery cell to be evaluated from both sides in a state in which the laminate is interposed therebetween.

In an exemplary embodiment of the present invention, the battery cell is a monocell in which a low-voltage defect has been confirmed, and is a monocell having a positive electrode/a separator/a negative electrode structure.

In an exemplary embodiment of the present invention, the unit electrodes are arranged in a matrix in the horizontal and vertical directions, having a coordinate information according to the matrix.

In an exemplary embodiment of the present invention, the unit electrodes have the same volume and shape, and have a rectangular parallelepiped or a regular hexahedron shape.

In an exemplary embodiment of the present invention, the unit electrode of the first measurement electrode and the unit electrode of the second measurement electrode having the same coordinate information constitute a single current circuit, and the current measuring device is configured to simultaneously measure each leakage current of current circuits corresponding to the number of the coordinate information.

In an exemplary embodiment of the present invention, a printed circuit board (PCB) including a plurality of current circuits corresponding to the number of the coordinate information is further included.

In an exemplary embodiment of the present invention, the printed circuit board is a flexible printed circuit board (FPCB).

The apparatus for detecting the location of a foreign material of a low-voltage battery cell according to an exemplary embodiment of the present invention further includes an amplifier for amplifying a leakage current.

The apparatus for detecting the location of a foreign material of a low-voltage battery cell according to an exemplary embodiment of the present invention further includes a power source for applying an external power source to a current circuit formed by the unit electrode of the first measurement electrode and the unit electrode of the second measurement electrode.

A method for detecting the location of a foreign material of a low-voltage battery cell according to an exemplary embodiment of the present invention includes: screening a low-voltage monocell causing a low-voltage in the battery cell including a plurality of monocells; and specifying the location of a foreign material using the apparatus for detecting for the location of a foreign material by measuring a leakage current of the screened low-voltage monocell.

In an exemplary embodiment of the present invention, the screening a low-voltage monocell includes: an insertion of an insulating film by opening a negative electrode portion of the low-voltage battery cell, cutting a negative electrode tab welding part, and inserting an insulating film between each negative electrode; an initial voltage measurement of measuring an initial open circuit voltage (OM) of each negative electrode; a pressurization of pressurizing the low-voltage battery cell; and a screening of a low-voltage monocell by monitoring an open circuit voltage of each negative electrode over time.

A method for analyzing a foreign material of a low-voltage defective battery cell according to an exemplary embodiment of the present invention includes: screening a low-voltage monocell causing a low-voltage in a battery cell including a plurality of monocells; specifying the location of a foreign material using the apparatus for detecting according to claim 1 by measuring a leakage current of the screened low-voltage monocell; and analyzing the type of a foreign material by sampling the vicinity of the location of the specified foreign material.

Advantageous Effects

A device and a method for detecting the location of a foreign material in a low-voltage battery cell according to the present invention measure a leakage current through a plurality of unit electrodes having coordinate information, and has an effect of quickly and accurately finding the location of a foreign material from the coordinate information of the unit electrode having a large leakage current.

REFERENCE NUMERALS

10: BATTERY CELL (MONOCELL)
100: APPARATUS FOR DETECTING LOCATION OF FOREIGN MATERIAL OF LOW-VOLTAGE BATTERY CELL
110: FIRST MEASUREMENT ELECTRODE
120: SECOND MEASUREMENT ELECTRODE
130: FIRST JIG
140: SECOND JIG
150: CURRENT MEASURING DEVICE
160: DATA PROCESSING PART
170: PRINTED CIRCUIT BOARD
1, 121: UNIT ELECTRODE
a1µa10, b1µb10, c1µc10, d1~d10: COORDINATE INFORMATION

BEST MODE FOR CARRYING OUT THE INVENTION

Since the present invention can apply various modifications and have various embodiments, specific embodiments will be exemplified and described in detail in the description. However, it should be understood that the present invention is not limited to specific embodiments, and includes all modifications, equivalents or alternatives within the spirit and technical scope of the present invention.

The terms used in the present invention are only used to describe specific embodiments, and are not intended to limit the present invention. Singular expressions include plural expressions unless the context clearly dictates otherwise.

The terms "comprise" or "have" are used herein to designate the presence of characteristics, numbers, steps, actions, components or members described in the specification or a combination thereof, and it should be understood that the possibility of the presence or addition of one or more other characteristics, numbers, steps, actions, components, members or a combination thereof is not excluded in advance.

Hereinafter the apparatus for detecting the location of a foreign material in a low-voltage battery cell according to the present invention will be described in detail.

Figure 1:
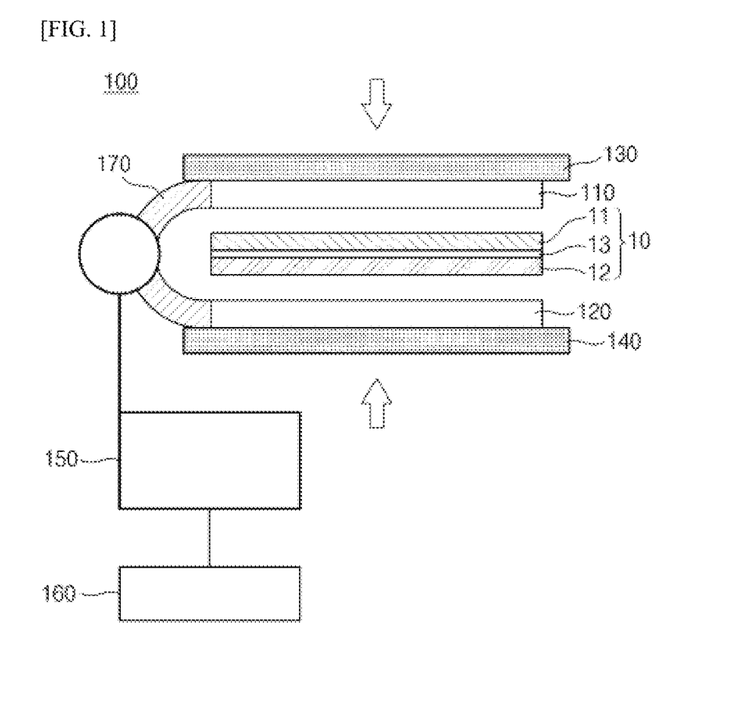
FIG. 1 is a side view of an apparatus for detecting the location of a foreign material in a low-voltage battery cell according to an exemplary embodiment of the present invention.
Figure 2:
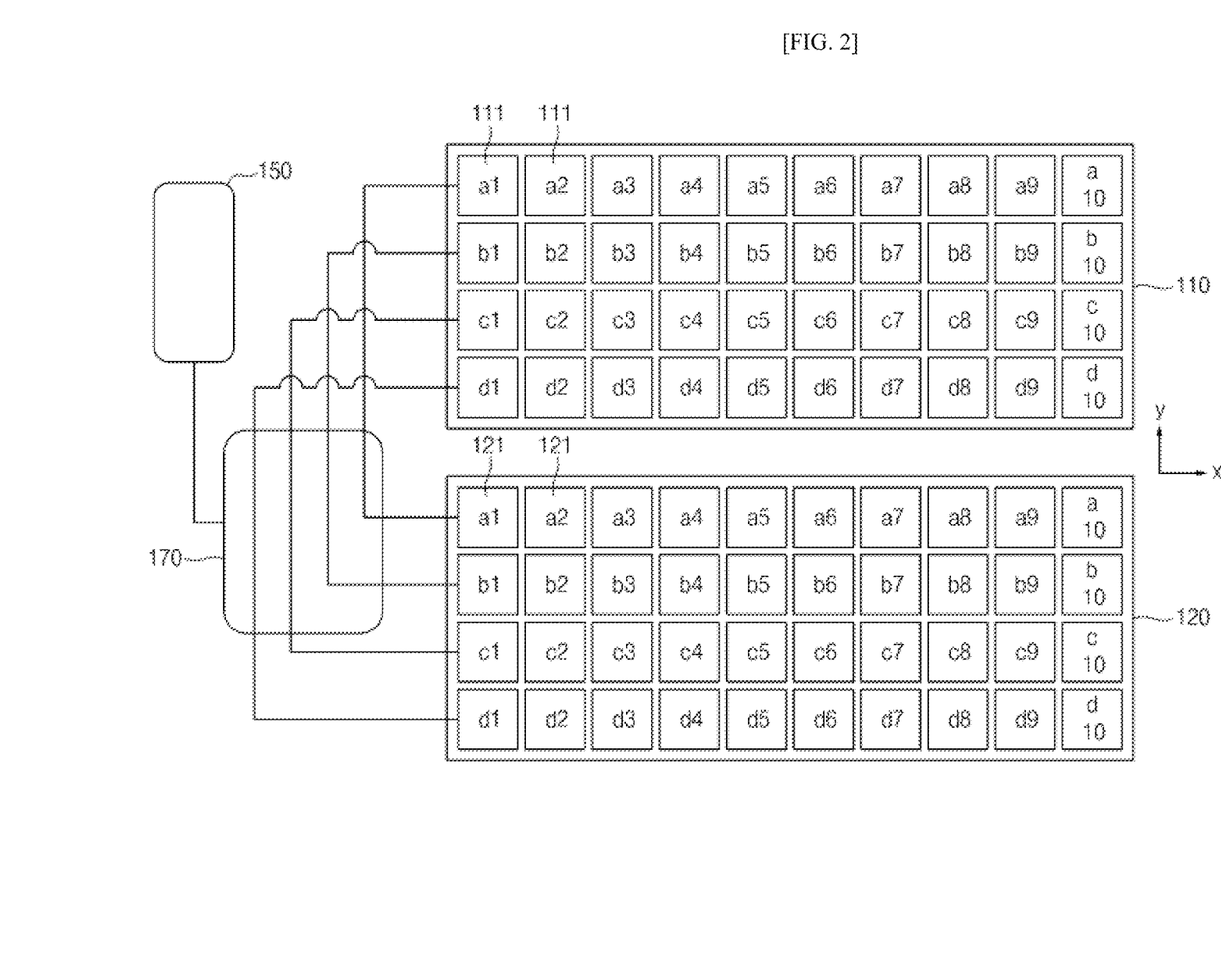
FIG. 2 is a top view of an apparatus for detecting the location of a foreign material in a low-voltage battery cell according to an exemplary embodiment of the present invention.

FIG. 1 is a side view of an apparatus for detecting the location of a foreign object in a low-voltage battery cell according to an exemplary embodiment of the present invention, and FIG. 2 is a top view of an apparatus for detecting the location of a foreign object in a low-voltage battery cell according to an exemplary embodiment of the present invention. Referring to these drawings, the apparatus for detecting the location of a foreign material of a low-voltage battery cell 100 according to the present invention includes: a first measurement electrode 110 and a second measurement electrode 120 disposed on a positive electrode 11 and a negative electrode 12 of a battery cell 10 to be evaluated, respectively, to measure a leakage current; a current measuring device 150 for measuring a leakage current; and a data processing part 160 for processing a measured leakage current data.

The battery cell 10 is interposed between the first measurement electrode 110 and the second measurement electrode 120, and the first measurement electrode faces the positive electrode 11 of the battery cell 10, and the second measurement electrode 120 faces the negative electrode 12, respectively.

The battery cell may be a monocell, and such a monocell has a structure in which a positive electrode/a separator/a, negative electrode are stacked. Since the apparatus for detecting the location of a foreign material of the present invention is for finding the location of a foreign material in a low-voltage defective battery cell, the monocell is a monocell in which the low-voltage defect has been confirmed.

The first measurement electrode 110 and the second measurement electrode 120 are electrically connected, and as they directly contact a low-voltage battery cell interposed therebetween, when a leakage current is induced in the low-voltage battery cell, a leakage current flows in the first measurement electrode 110 and the second measurement electrode 120. Also, the current measuring device 160 measures leakage current flowing through the first measurement electrode and the second measurement electrode.

In order to detect the location of a foreign material that causes a leakage current in a low-voltage battery cell, the first measurement electrode 110 and the second measurement electrode 120 has a structure in which a plurality of unit electrodes 111, 121 to which coordinate information is assigned, respectively, are aggregated. The plurality of unit electrodes 111 constituting the first unit electrode are arranged in a matrix along the horizontal direction (X-axis direction) and the vertical direction (Y-axis direction), and thus have coordinate information according to the matrix. Accordingly, the coordinate information indicates the information of the location the foreign material in the first measurement electrode and the second measurement electrode.

Referring to FIG. 2, in the first measurement electrode 110, a plurality of unit electrodes 111 are arranged in a matrix along the vertical direction (Y-axis direction) and the horizontal direction (X-axis direction), and similarly, in the second measurement electrode 120, a plurality of unit electrodes 121 are arranged in a matrix along the vertical direction (Y-axis direction) and the horizontal direction (X-axis direction).

For example, the unit electrodes 111 constituting the first measurement electrode form rows a, h, c, d along the vertical direction, and columns 1, 2, 3 . . . 10 along the horizontal direction. Coordinate information of a1 may be given to the unit electrode located in row a, column 1, and coordinate information of d10 may be given to the unit electrode located in row d, column 10. A method of assigning coordinate information to the unit electrodes 121 constituting the second measurement electrode is the same as above.

In addition, the unit electrode of the first measurement electrode and the unit electrode of the second measurement electrode having the same coordinate information are electrically connected to form one current circuit, and the current measuring device measures a leakage current flowing through the unit electrode of the first measurement electrode and the unit electrode of the second measurement electrode having the same coordinate information.

Specifically, the unit electrode of a1 of the first measurement electrode and the unit electrode of a1 of the second measurement electrode form a pair to be electrically connected, and the unit electrode of b1 of the first measurement electrode and the unit of b2 of the second measurement electrode form a pair to be electrically connected. Although not shown in FIG. 2, the unit electrodes to which the remaining coordinate information is assigned are also paired and electrically connected in this manner. Accordingly, a plurality of current circuits corresponding to the number of coordinate information are configured, and the current measuring device simultaneously measures leakage current flowing through each of the plurality of current circuits, thereby enabling measurement of leakage current according to the coordinate information.

Since the location of the foreign material should be found according to the coordinate information, it is preferable that the plurality of unit electrodes to which the coordinate information is assigned have the same volume and shape. This is because, if the volume and shape of the unit electrodes are not the same, the leakage current is affected by these factors, and thus it may be difficult to detect the location of the foreign material through simple comparison of the leakage current.

The data processing part 160 checks the location of the foreign material from the leakage current data measured by the current measuring device through coordinate information of a unit electrode having a large leakage current. The leakage current measured in the current circuit formed by the unit electrode at the location where the foreign material exists is larger than the leakage current measured in the current circuit formed by the other unit electrodes.

Figure 5:
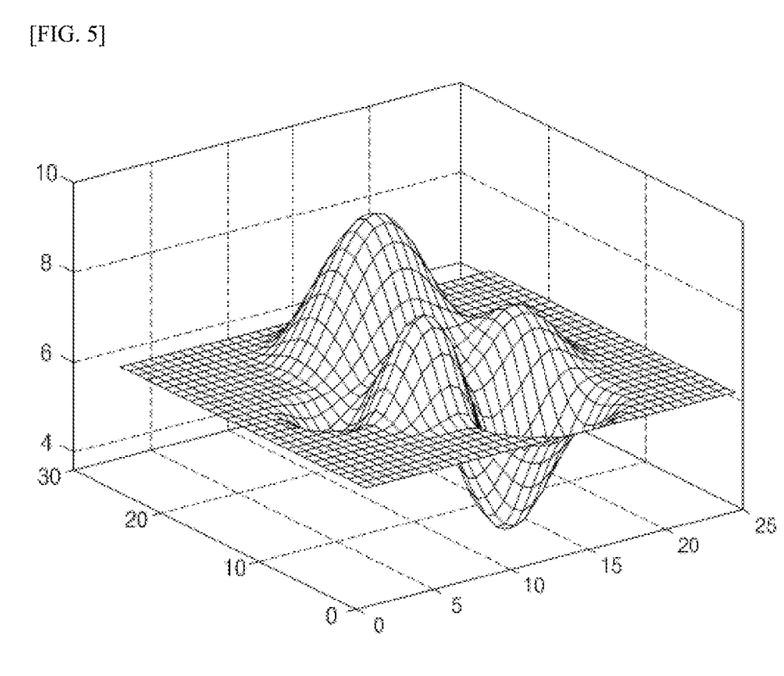
FIG. 5 is a diagram showing a leakage current measured by an analyzer of the present invention.

FIG. 5 is a diagram showing a leakage current measured by an analyzer of the present invention. The data processing part 160 may process the plurality of leakage current values measured by the current measuring device 150 according to the coordinate information, and print them out as shown in FIG. 5. Accordingly, by checking the coordinate information with a large leakage current, it can be determined that there is a foreign material at the location of the corresponding coordinate information.

Accordingly, since the apparatus for detecting the location of a foreign material in a low-voltage battery cell of the present invention can accurately detect the location of leakage current in the low-voltage battery cell to be inspected through the unit electrode to which coordinate information is assigned, compared to the conventional method of inspecting the location of a foreign material and through visual inspection, when finding a suspected foreign material or sampling multiple suspected locations, there is an effect of dramatically improving work load and dramatically enhancing time and analysis accuracy.

In one specific example, the apparatus for detecting the location of a foreign material in a low-voltage battery cell according to the present invention may further include a first jig 130 and a second jig 140. The first and second jigs 130, 140 may be configured to press a laminate from both sides of the laminate in a state in which the laminate of the first and second measurement electrodes 110, 120 and the battery cell 10 to be evaluated are interposed between the first and second jigs 130, 140.

Pressurizing both sides of the laminate of the first and second measurement electrodes 110, 120 and the battery cell 10 to be evaluated is to maximally induce a leakage current. When the laminate is pressurized, the positive and negative electrodes are applied with an electric current at the location Where the foreign material is present by the pressurization, and the battery cell to be evaluated requires current to maintain the voltage, so leakage current is generated. And the leakage current generated in this way flows through the first and second measurement electrodes in contact with the positive electrode and the negative electrode, so that the leakage current can be measured through a current measuring device.

The structure of the first jig 130 and the second jig 140 is not limited in the structure and shape as long as it is capable of pressurizing the laminate of the first and second measurement electrodes 110, 120 and the battery cell 10 to be evaluated.

In one specific example, the first and second jigs 130, 140 may have a rectangular plate shape, and the size of the pressing surface may correspond to the area the laminate of the first and second measurement electrodes 110, 120 and the battery to be evaluated face.

In one specific example, the apparatus for detecting the location of a foreign material in a low-voltage battery cell according to the present invention may further include an amplifier that amplifies the leakage current. This is to increase the discrimination of the leakage current value when the leakage current value is low.

In addition, the apparatus for detecting the location of a foreign material in a low-voltage battery cell according to another specific example may include a power source for applying external power to a current circuit formed by a unit electrode of the first measurement electrode and a unit electrode of the second measurement electrode. This is also added to increase the discrimination of the leakage current value when the leakage current value is low.

In one specific example, the apparatus for detecting the location of a foreign material in a low-voltage battery cell according to the present invention may include a printed circuit board (PCB) in which current circuits corresponding to the number of the coordinate information are assembled. Accordingly, wires for electrically connecting the unit electrodes of the first measurement electrode and the unit electrodes of the second measurement electrode are unnecessary, these circuits are stabilized, and uniformity and reliability are increased. Also, the printed circuit board may be a flexible printed circuit board (FPCB). A flexible printed circuit board has the advantage of enabling a three-dimensional wiling, miniaturization, and weight reduction.

Hereinafter, a method for detecting the location of a foreign material in a low-voltage battery cell according to the present invention will be described in detail.

Figure 3:
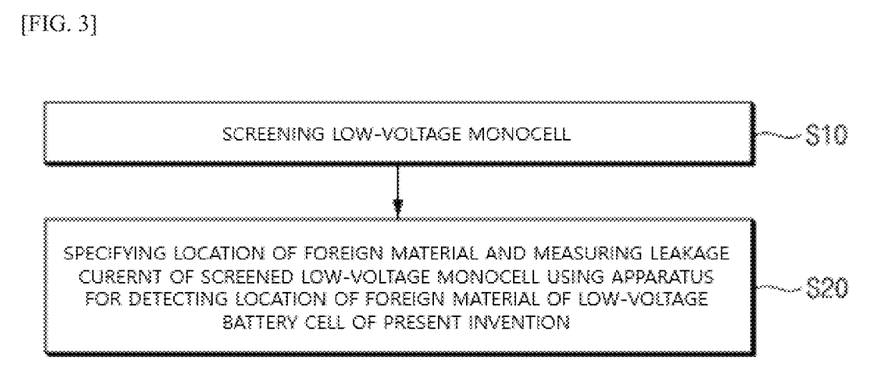
FIG. 3 is a flowchart of a method for detecting the location of a foreign material in a low-voltage battery cell according to an exemplary embodiment of the present invention.

FIG. 3 is a flowchart of a method for detecting the location of a foreign object in a low-voltage battery cell according to an exemplary embodiment of the present invention. Referring to FIG. 3, the method for detecting the location of a foreign object in a low-voltage battery cell according to the present invention includes: screening S10 a low-voltage monocell causing a low-voltage in the battery cell containing a plurality of monocells; and specifying S20 the location of a foreign material using the apparatus for detecting the location of a foreign material by measuring a leakage current of the screened low-voltage monocell.

A stack type or a stack/folding type battery cell has a structure in which a monocell having a positive electrode/a separator/a negative electrode structure is stacked in numbers, and the screening S10 of a low-voltage monocell is a step of screening the monocell in which the foreign material is located in the low-voltage battery cell.

Figure 4:
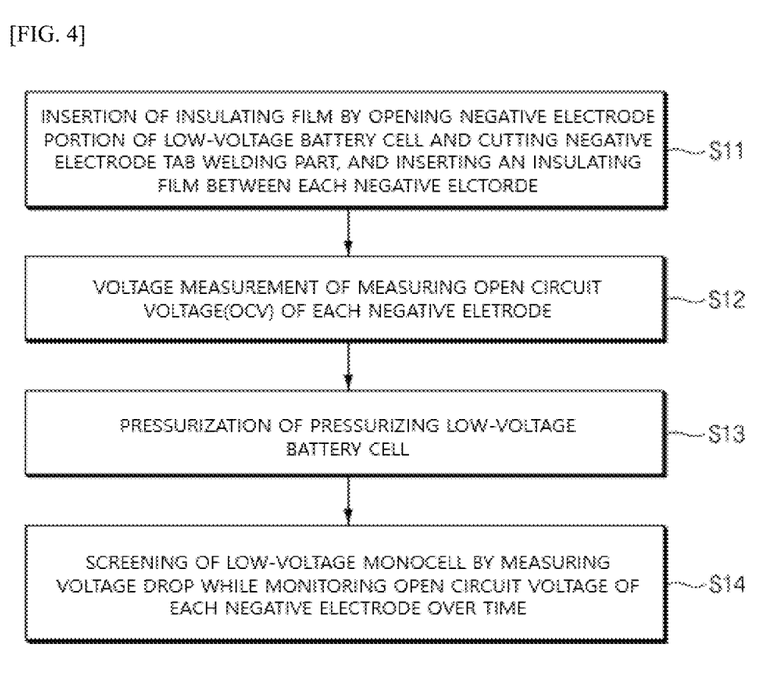
FIG. 4 is a flow chart of a low-voltage monocell screening step according to an exemplary embodiment of the present invention.

FIG. 4 is a flow chart of a monocell screening step according to an exemplary embodiment of the present invention. Referring to FIG. 4, the screening S10 of monocell includes: an insertion of an insulating film S11 by opening a negative electrode portion of the low-voltage battery cell, cutting a negative electrode tab welding part, and inserting an insulating film between each negative electrode; an initial voltage measurement S12 of measuring an initial open circuit voltage (OCV1) of each negative electrode; a pressurization S13 of pressurizing the low-voltage battery cell; and a screening S14 of a low-voltage monocell by monitoring an open circuit voltage of each negative electrode over time.

The insertion of an insulating film S11 inserts an insulating film for insulating between monocells in order to measure an open circuit voltage (OCV) in units of individual monocells in a plurality of monocells.

The initial voltage measurement step S12 measures for the comparison of the amount of voltage drop. A low-voltage battery cell is a battery cell in which the amount of voltage drop exceeds the self-discharge amount, and over time, a battery cell with a large voltage drop is selected as a low-voltage monocell. To compare the amount of voltage drop, the initial voltage is measured and recorded, and then a low-voltage monocell is screened by calculating the difference to the voltage (amount of voltage drop) according to the lapse of time. Here, the open circuit voltage is measured for all negative electrodes.

After measuring the initial open circuit voltage, a pressurization S13 of pressurizing the battery cell is performed. The pressurization step is for accelerating the voltage drop. The pressurizing means is not particularly limited as long as it can accelerate the voltage drop, and as a specific example, it may be a press jig including a pair of press plates capable of pressurizing both sides of the battery cell. Since the electrolyte solution may leak in the pressurization step, it is preferable to enclose and seal the electrolytic cell in a packaging material capable of sealing the electrolytic cell before proceeding with the pressurization step. Such a packaging material is not particularly limited as long as it is a material capable of preventing leakage of the electrolyte solution, and specifically may be a plastic packaging material.

In the screening step S14, the open circuit voltage of each negative electrode is measured over time as the amount of voltage drop is calculated, and a monocell including a negative electrode having a large voltage drop is screened as a low-voltage battery cell.

In this way, after screening the monocell causing the low voltage in the low voltage battery cell, the step S20 of confirming the location of the foreign material causing the leakage current is performed by measuring the leakage current of the monocell using the above-described apparatus for detecting the location of a foreign material.

The above-described apparatus for detecting the location of a foreign material has a structure in which a plurality of unit electrodes to which coordinate information is assigned are assembled in a first measurement electrode and a second measurement electrode for measuring leakage current. Since it detects the location of a foreign material according to the coordinate information showing a large leakage current by measuring the leakage current for the current circuit constituted by the first measurement electrode and the second measurement electrode having the same coordinate information, the method for detecting the location of a foreign material according to the present invention has an effect of quickly and accurately detecting the location of a foreign material causing the low-voltage.

Hereinafter, a method for analyzing a foreign material of a low-voltage battery cell according to the present invention will be explained.

Figure 6:
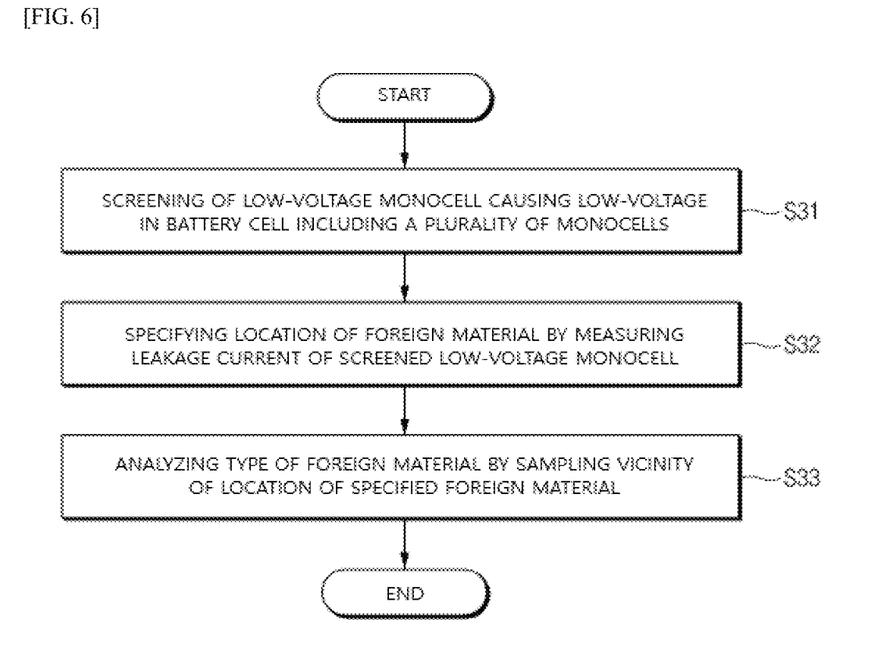
FIG. 6 is a flowchart of a foreign material analysis method of a low-voltage defective battery cell according to an exemplary embodiment of the present invention.

FIG. 6 is a flowchart of a foreign material analysis method of a low-voltage defective battery cell according to an exemplary embodiment of the present invention. Referring to FIG. 6, the method for analyzing a foreign material of a low-voltage battery cell according to the present invention includes: screening S31 of a low-voltage monocell of screening a monocell causing a low-voltage in a battery cell containing a plurality of monocells; specifying S32 the location of a foreign material using the detection device according to claim 1 by measuring a leakage current of the screened low-voltage monocell; and analyzing S33 the type of a foreign material by sampling the vicinity of the location of the specified foreign material.

Since the specific details of the step of screening the monocell S31 and the step specifying the location of a foreign material S32 have been described above, further description will be omitted.

Analyzing the type of a foreign material S33 is a step of sampling the vicinity of the specified location of a foreign material, and analyzing the type of a foreign material with the sampled specimen, and specifically, a FE-SEM-EDS analysis method can be used. Here, sampling means manufacturing a specimen so that the specified foreign material can be included.

The FE-SEM-EDS analysis method uses equipment used for a high-resolution, a high-magnification, and a low-damage surface analysis, enabling microstructure analysis, morphology, cross-section analysis, and particle size analysis, etc., and qualitative and quantitative analysis of an unknown sample are possible with an EDS equipment. The analytical method of the present invention has an effect of improving analysis accuracy because the sampled specimen has a very high probability of containing foreign materials causing low-voltage.

As above, the present invention has been described with reference to exemplary embodiments, but it should be understood by those skilled in the art or those of ordinary skill in the art that the present invention can be variously modified and changed without departing from the spirit and technical scope of the present invention described in the accompanying claims.

Therefore, the technical scope of the present invention should not be limited to the contents described in the detailed description of the specification, but should be defined by the claims.

The invention claimed is:

1. An apparatus for detecting the location of a foreign material of a low-voltage battery cell, comprising:
    a first measurement electrode and a second measurement electrode disposed respectively on a positive electrode and a negative electrode of the battery cell to measure a leakage current;
    a current measuring device configured to measure a leakage current; and
    a data processor configured to process a measured leakage current data,
    wherein the first and second measurement electrodes each have a structure in which a plurality of unit electrodes to which coordinate information is assigned are collected,
    wherein the current measuring device is configured to measure a leakage current flowing through the unit electrode of the first measurement electrode and the unit electrode of the second measurement electrode that have the same coordinate information and are electrically connected, and
    wherein the data processing part is configured to check the location of a foreign material from a leakage current data through a coordinate information of a unit electrode having a large leakage current.

2. The apparatus for detecting the location of a foreign material of a low-voltage battery cell of claim 1, further comprising, a first jig and a second jig, wherein the first and second jigs are configured to press a laminate of the first and second measurement electrodes and the battery cell to be evaluated from both sides with the laminate being interposed between the first and second jigs.

3. The apparatus for detecting the location of a foreign material of a low-voltage battery cell of claim 1, wherein the battery cell is a monocell in which a low-voltage defect has been confirmed, and is a monocell having a positive electrode/a separator/a negative electrode structure.

4. The apparatus for detecting the location of a foreign material of a low-voltage battery cell of claim 1, wherein the unit electrodes are arranged in a matrix in horizontal and vertical directions, having a coordinate information according to the matrix.

5. The apparatus for detecting the location of a foreign material of a low-voltage battery cell of claim 1, wherein the unit electrodes each have a same volume and shape, and each have a rectangular parallelepiped or a regular hexahedron shape.

6. The apparatus for detecting the location of a foreign material of a low-voltage battery cell of claim 1, wherein the unit electrode of the first measurement electrode and the unit electrode of the second measurement electrode having the same coordinate information constitute a single current circuit, and
    wherein the current measuring device is configured to simultaneously measure each leakage current of current circuits corresponding to the number of the coordinate information.

7. The apparatus for detecting the location of a foreign material of a low-voltage battery cell of claim 6, further comprising a printed circuit board (PCB) including a plurality of current circuits corresponding to the number of the coordinate information.

8. The apparatus for detecting the location of a foreign material of a low-voltage battery cell of claim 7, wherein the printed circuit board includes a flexible printed circuit board (FPCB).

9. The apparatus for detecting the location of a foreign material of a low-voltage battery cell of claim 1, further comprising an amplifier for amplifying a leakage current.

10. The apparatus for detecting the location of a foreign material of a low-voltage battery cell of claim 1, further comprising a power source configured to apply an external power source to a current circuit formed by the unit electrode of the first measurement electrode and the unit electrode of the second measurement electrode.

11. A method for detecting the location of a foreign material of a low-voltage battery cell comprising:
  screening a low-voltage monocell causing a low-voltage in a battery cell including a plurality of monocells; and
  specifying the location of a foreign material using the apparatus for detecting according to claim 1 by measuring a leakage current of the screened low-voltage monocell.

12. The method for detecting a location of a foreign material of a low-voltage battery cell of claim 11, wherein the screening a low-voltage monocell comprises:
  opening a negative electrode portion of the low-voltage battery cell, cutting a negative electrode tab welding part,
  inserting an insulating film between each negative electrode;
  measuring an initial open circuit voltage (OCV1) of each negative electrode;
  pressurizing the low-voltage battery cell; and
  screening of a low-voltage monocell by monitoring an open circuit voltage of each negative electrode over time.

13. A method for analyzing a foreign material of a low-voltage defective battery cell, comprising:
  screening a low-voltage monocell causing a low-voltage in a battery cell including a plurality of monocells;
  specifying the location of a foreign material using the apparatus for detecting according to claim 1 by measuring a leakage current of the screened low-voltage monocell; and
  analyzing the type of the foreign material by sampling the vicinity of the location of the specified foreign material.

* * * * *